United States Patent
Horbach

[11] 3,934,177
[45] Jan. 20, 1976

[54] HEAT SINK CASING FOR CIRCUIT BOARD COMPONENTS

[76] Inventor: Stephen Horbach, 40 Glen Road, Mountain Lakes, N.J. 07046

[22] Filed: Jan. 9, 1975

[21] Appl. No.: 539,870

[52] U.S. Cl............ 317/100; 317/101 D; 174/15 R
[51] Int. Cl.² ........................................ H05K 7/20
[58] Field of Search ............ 174/52 R, 52 PE, 15 R, 174/DIG. 5; 317/101 R, 101 CB, 101 D, 100, 120

[56] References Cited
UNITED STATES PATENTS

| | | | |
|---|---|---|---|
| 3,328,642 | 6/1967 | Haumesser | 317/100 |
| 3,569,788 | 3/1971 | Niblack | 317/101 R |
| 3,699,394 | 10/1972 | Schuler | 317/100 |
| 3,816,911 | 6/1974 | Knappenberger | 317/101 R |
| 3,873,889 | 3/1975 | Leyba | 317/101 R |

Primary Examiner—Gerald P. Tolin
Attorney, Agent, or Firm—Ryder, McAulay, Fields, Fisher & Goldstein

[57] ABSTRACT

A case containing and supported on a channel like bracket that divides the case into two chambers. A first chamber contains the signal processing circuitry. The second chamber contains the power circuitry. The power transistors are mounted on the main wall of the bracket, in the second chamber, so that the bracket acts as a heat sink. The bracket has side walls which extend along inner walls of the case in good thermal contact therewith to provide heat conduction. A variable resistor faces out an opening in the top of the case to permit used adjustment of the timing constant. The resistor is mechanically supported on an edge of the bracket to prevent the resistor being pushed into the case while being adjusted.

12 Claims, 7 Drawing Figures

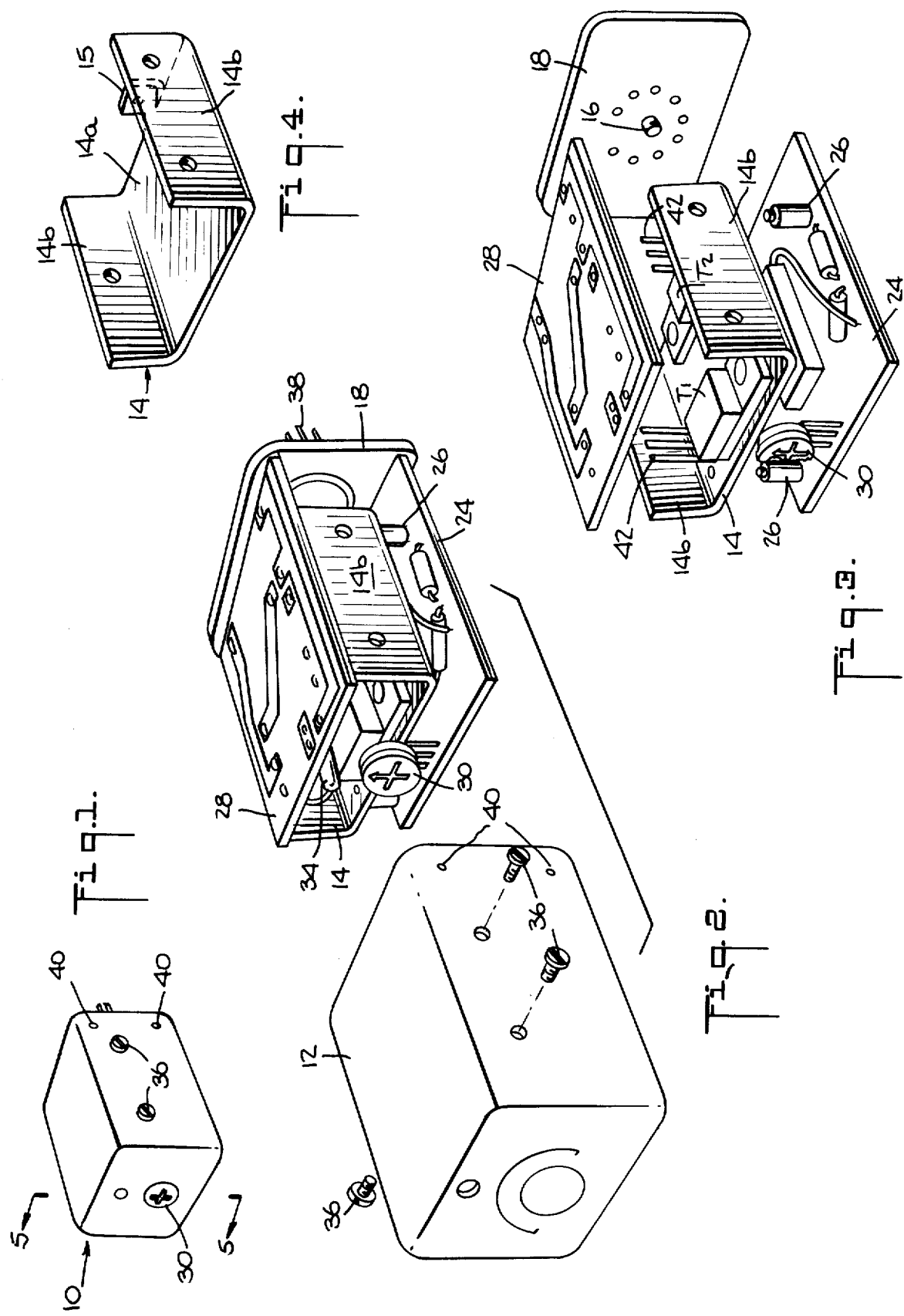

HEAT SINK CASING FOR CIRCUIT BOARD COMPONENTS

BACKGROUND OF THE INVENTION

Electrical timers are an old and varied group of devices. They operate using a wide variety of techniques including mechanical, dashpot, thermal and electronic. The various types of timers have different advantages, as a function of cost, over each other in the areas of reliability, repeatability, life expectancy, size, recycle time, power consumption and versatility.

For modern uses, size has become an increaseingly important consideration. Small size units generally carry with them the additional advantages of lesser weight and smaller power consumption. The use of modern semiconductors can be a big advantage in reducing size, weight and power consumption. However, the advantages attendant upon the use of semiconductors are obtained only if they are operated within their electrical and thermal ratings. The thermal rating, in particular, becomes a critical factor when designing for small size. It becomes necessary to adequately dissipate the heat so as to prevent the detoriated performance that ocurrs when the thermal ratings are exceeded.

Accordingly, it is a major purpose of this invention to provide a small size, semiconductor based, electronic timer having heat dissipation characteristics which will maintain the semiconductors within their thermal ratings.

In many functions, a timer may be used repeatedly over a relatively short period of time. As the timer is used, the ambient temperature of the timing circuit tends to increase because of the heat generated. This may cause the time constant of the timing circuit to vary as a function of temperature.

Accordingly, it is another purpose of this invention to provide a timer design in which not only is the heat adequately dissipated but in which the temperature rise to which the timing circuit is subjected is minimized during a period of repeated use of the timer.

In most applications, a timer has to be designed so the user can set the switching time to the desired interval. Accordingly, it is a further purpose of this invention to achieve the above purposes in a design that permits the user to readily and simply adjust the switching time.

As is usually the case in industrial applications, it is an important purpose of the invention to achieve all the above results in an economical design that is efficient not only in its use of power but is also relatively easy to fabricate, simple to maintain and inexpensive to produce.

Thus, it can be said that an overall purpose of this invention is to provide an optimum trade off between the conflicting parameters of small size, high thermal dissipation, high versatility and low cost.

BRIEF DESCRIPTION OF THE INVENTION

In brief, this invention employs a main bracket of relatively substantial mass and size; at least, substantial relatively to the total timer dimensions and weight. This bracket acts as a heat sink for the power transistors in the timer. The bracket also acts as an effective means to conduct heat directly to the case so that the case can operate as a heat radiator and so that convection cooling does not have to be relied on alone. The bracket divides the interior of the timer case into two compartments. In one compartment all of the power circuitry, including the power transistors, are located. In the other compartment the timing circuitry is located. Thus the bracket acts as a heat shield between the heat generating power portion and the timing portion.

In cross section, the bracket is roughly a U-shaped channel. It has a main wall which divides the case into two compartments and which operates as the heat shield. The bracket has two side walls which extended along two of the walls of the case in good thermal contact therewith to provide heat conduction to the case itself.

The main components of the timer are mechanically mounted to the bracket rather than to each other. The timing circuit is spaced from the bracket and mounted to the bracket by two spacers. The spacing serves to minimize the temperature rise at the elements of the timing circuit. A potentiometer is electrically connected to the timing circuit and extends through the case so that the user can vary its resistance, thus vary an RC time constant thereby setting the switching time of the timer. This potentiometer rests on an edge of the bracket so that, in use, the manipulation of the potentiometer will not result in pushing the potentiometer into the case. The power circuit is mounted directly to the bracket through the transistors. The metal heat sink head of the transistors is screwed directly onto the bracket so that the bracket will operate as a heat sink for the transistors. The base of the timer has a series of pins to which the signal and power leads are connected. The base is also mounted to a depending leg of the bracket. The metal case slips over the entire structure such that two walls of the case slip over the side walls of the bracket in good thermal contact therewith.

BRIEF DESCRIPTION OF THE DRAWINGS

FIG. 1 is a perspective view of the electronic timer of this invention.

FIG. 2 is an exploded perspective view showing the case removed from the rest of the timer.

FIG. 3 is an exploded perspective view of the main units within the case illustrating, primarily, two PC boards, the main bracket and a base.

FIG. 4 is a perspective view of a main bracket employed in the timer.

DESCRIPTION OF THE PREFERRED EMBODIMENT

Figure 5:
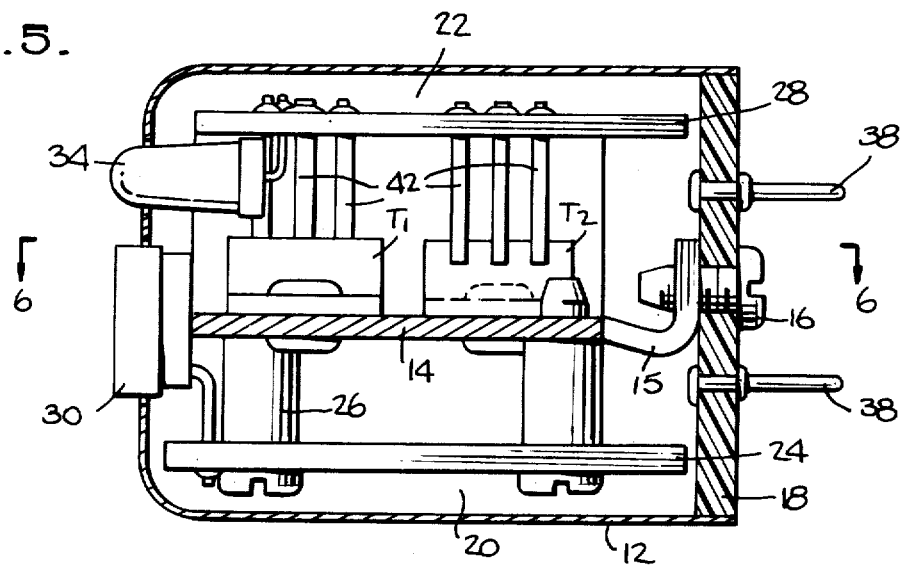
FIG. 5 is an edge view of the interior of the case with the sidewall of the main bracket cut away so that the interior can be viewed.

With references to the FIGS., all of which relate to the same embodiment, the timer 10 of this invention includes a case 12. A main U-shaped bracket 14 has an L-shaped leg 15. A screw 16 fastens a base 18 to the leg 15. The main bracket 14 is within the case 12 and divides the interior of the case 12 into two main chambers 20 and 22. As will be described in greater detail below, the purposes of this main bracket 14 include functioning as a heat shield, functioning as a heat sink and providing mechanical support.

Within the first chamber 20 of the interior of the case 12, there is mounted a first printed circuit (PC) board 24. This PC board 24 is mounted (by screws) to the main bracket 14 but held spaced from the main bracket 14 by two diagonally positioned spacers 26. This PC board 24 contains the timing modules and thus the chamber 20 will be referred to herein as the control portion of the timer 10.

The second chamber 22 contains two power transistors T1 and T2 as well as a second PC board 28 to which the power circuitry of the timer is mounted. Accordingly, the chamber 22 will be referred to herein as the power portion of the timer 10. The two transistors T1 and T2 are electrically connected to this second PC board 28. Indeed, the second PC board 28 is supported by the leads of the transistors.

A potentiometer 30 is mounted to face through an opening in the top of the case 12 so that the user can vary the resistance of this potentiometer 30. This variable resistor 30 is electrically connected to the timing circuitry in the first PC board 24.

The transistors T1 and T2 have a metal heat sink head portion 32. These heads 32 are fastened by eyelets, in good thermal contact, to the main bracket 14. Thus the main bracket 14 acts as a heat conductor and assures that the transistors T1, T2 are provided with an effective heat sink.

Because the transistors T1 and T2 and all the power components are positioned on the power portion 22 side of the bracket 14, the bracket 14 serves as a shield to keep the temperature of the components on the timing board 24 from getting excessively high. As a consequence, there is an improved stability in the reset timing selected by the user over the range of conditions from a cold start to whatever temperature is achieved in the timer after it has been running for a substantial period of time.

The variable resistor 30 is connected to the timing board 24 by small flexible leads. The base of this variable resistor (potentiometer) 30, and more specifically the molded plastic case within which the resistance element is mounted, is set against an upper edge of the bracket 14. Thus the bracket 14 provides support for the potentiometer 30 when the user sets the time desired. The leads from the potentiometer do not provide enough support to prevent the potentiometer 30 from being pushed into the interior of the shell 12 and thus the bracket 14 provides mechanical support for this potentiometer 30. The bracket 14 also provides mechanical support for the timing board 24, through the two diagonally placed spacers 26. The bracket 14 further provides mechanical support for the power board 28 through the transistors T1 and T2.

A light emitting diode (LED) 34 is mounted to the power board 28 and extends through a second opening in the top of the case 12 in order to provide an indication that the timer is on. Four vent openings 40 aid in dissipating heat.

Although broadly speaking the bracket 14 is U-shaped, it is more like a channel having a main wall 14a and two side walls 14b. The leg 15 of the bracket extends down from the main wall 14a. The transistors T1, T2 as well as the two PC boards 24 and 28 are all mounted to the main wall 14a. The case 12 is attached to the two side walls 14b of the bracket 14 by three small screws 36. Thus good thermal contact is made between the case 12 and the bracket 14 so that heat can be dissipated and the case 12 will aid in the dissipation of heat.

The base 18 has a series of pins 38 which extend through the base. The leads from the timing circuit and from the power circuit are connected to these pins 38 and the result is that the entire assembled timer can be plugged into a circuit in which it is designed to be used.

Thus, all of the elements of the timer are mounted directly or indirectly to the main bracket 14. Although all of the elements of the timer 10 are mounted within the case 12, none of these elements are mounted to the walls of the case 12 except through the main bracket 14.

Because of this support structure, the separation of the timing circuitry and the power circuitry and the use of the bracket 14 as heat sink, heat conductor, heat shield and main support member, it was possible in one embodiment to provide a two ampere switch in a case approximately 1½ × 1¼ × 1¼ inches. In that embodiment, the bracket 14 was fabricated from 0.062 inch thick aluminum.

Figure 6:
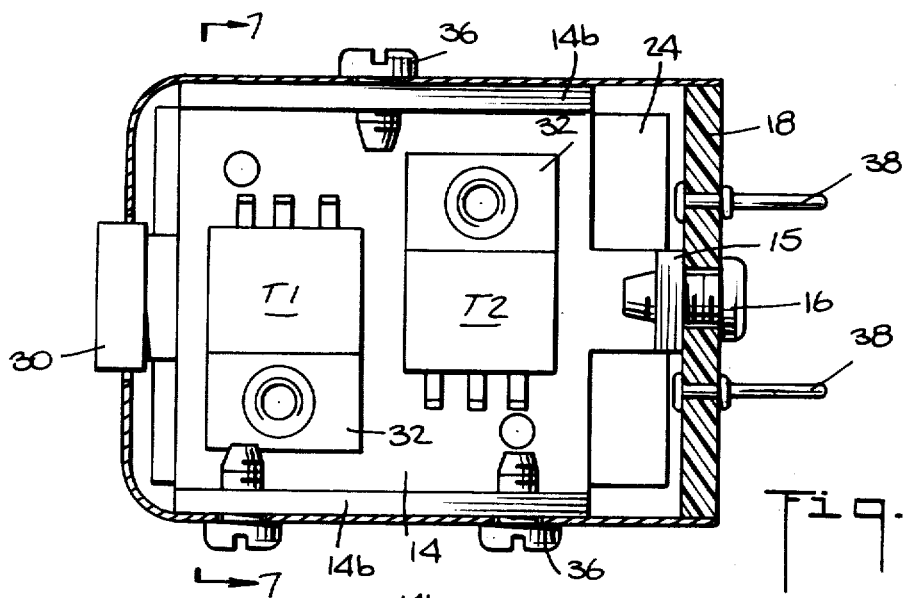
FIG. 6 is a cross-sectional view along the line 6—6 of FIG. 5 showing the interior of a case looking at the transistors mounted on the main wall of the bracket.
Figure 7:
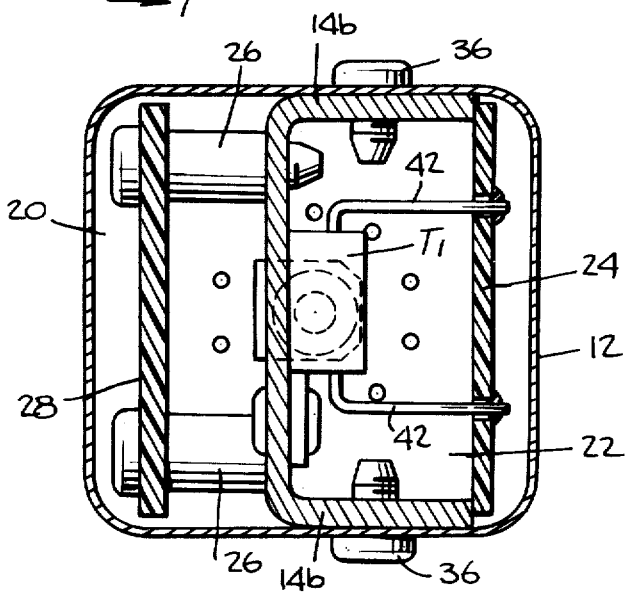
FIG. 7 is a cross-sectional view along the line 7—7 of FIG. 6 showing the interior of a case as viewed from the top from a plane just under the potentiometer.

To simplify illustration, FIGS. 5–7 do not show the electrical elements (resistors and capacitors mainly) that project inboard from the two PC boards 24, 28 and FIGS. 2–3 only suggest some of the circuit elements.

The timing PC board 24 is held to the bracket 14 by two screws 41 and held spaced by the spacers 26 through which the screws 41 extend. So too, the power PC board 28 is held to the bracket 14 by the transistor leads 42 and is held spaced by the sidewalls 14b of the bracket.

What is claimed is:

1. A manually adjustable electrical circuit support structure comprising:
    a case,
    a channel-shaped bracket having a main wall and two side walls, said main wall extending longitudinally and laterally through said case to divide the interior of said case into substantially first and second chambers, said side walls extending along attached to the inner walls of said case in thermal contact with said walls of said case,
    a processing first circuit board spaced from said bracket and within said first chamber, said circuit board being mechanically supported by said bracket,
    a second circuit board within said second chamber and mechanically supported by said bracket,
    power transistors connected with said second circuit board said power transistors mounted directly on said bracket in said second chamber and in thermal contact with said bracket, said bracket acting as a heat sink for said transistors, and
    a variable electrical element connected to said first circuit board, said variable element operable through an opening in a wall of said case to permit user adjustment of the electrical parameter of said element, a surface of said element bearing on an edge of said main bracket, said main bracket preventing said element from being pushed into said case.

2. The structure of claim 1 further comprising:
    a base mechanically mounted to the lower edge of said bracket, and
    pins extending through said base, said first circuit board and said second circuit board being electrically connected to said pins of said base.

3. The structure of claim 2 wherein:

said base is mechanically supported solely by said bracket, said second circuit board is mechanically supported solely by said bracket, said first circuit board is mechanically supported solely by said bracket, and said variable element is mechanically supported by said bracket in a direction orthogonal to the plane of said case wall through which said elements extend.

4. The structure of claim 1 wherein said side walls of said bracket extend along the walls of said case in said second chamber and away from said first circuit board.

5. The structure of claim 2 wherein said side walls of said bracket extend along the walls of said case in said second chamber and away from said signal circuit.

6. The structure of claim 3 wherein said side walls of said bracket extend along the walls of said case in said second chamber and away from said first circuit board.

7. A manually adjustable electrical unit comprising:

a case, a channel-shaped bracket having a main wall and two side walls, said main wall extending longitudinally and laterally through said case to divide the interior of said case into substantially first and second chambers, said side walls extending along and attached to the inner walls of said case in thermal contact with said walls of said case, a first circuit board spaced from said bracket and within said first chamber, said circuit board being mechanically supported by said bracket, a second circuit board within said second chamber and mechanically supported by said bracket.

power transistors connected with said second circuit board, said power transistors mounted directly on said bracket in said second chamber and in thermal contact with said bracket, said bracket acting as a heat sink for said transistors, and a variable resistor electrically connected to said first circuit board, said variable resistor operable through an opening in a wall of said case to permit user adjustment of the resistance of said resistor, a surface of said resistor bearing on an edge of said main bracket, said main bracket preventing said resistor from being pushed into said case.

8. The unit of claim 7 further comprising:

a base mechanically mounted to the lower edge of said bracket, and pins extending through said base, said first circuit board and said second circuit board being electrically connected to said pins of said base.

9. The timer of claim 8 wherein:

said base is mechanically supported solely by said bracket, said second circuit board is mechanically supported solely by said bracket, said first circuit board is mechanically supported solely by said bracket, and said resistor is mechanically supported by said bracket in a direction orthogonal to the plane of said case wall through which said resistor extends solely by said brakcet.

10. A timer of claim 7 wherein said side walls of said bracket extend along the walls of said case in said second space and away from said first circuit board.

11. A timer of claim 8 wherein said side walls of said bracket extend along the walls of said case in said second space and away from said timing circuit.

12. A unit of claim 9 wherein said side walls of said bracket extend along the walls of said case in said second space and away from said first circuit board.

* * * * *